United States Patent
Kuki et al.

(10) Patent No.: US 11,587,942 B2
(45) Date of Patent: Feb. 21, 2023

(54) SEMICONDUCTOR MEMORY DEVICE

(71) Applicant: Kioxia Corporation, Minato-ku (JP)

(72) Inventors: Tomohiro Kuki, Yokkaichi (JP); Tatsufumi Hamada, Nagoya (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/986,657

(22) Filed: Aug. 6, 2020

(65) Prior Publication Data
US 2020/0381444 A1    Dec. 3, 2020

Related U.S. Application Data

(63) Continuation-in-part of application No. 16/294,026, filed on Mar. 6, 2019, now abandoned.

(30) Foreign Application Priority Data

May 23, 2018 (JP) .............................. JP2018-098529

(51) Int. Cl.
| | | |
|---|---|---|
| H01L 27/11556 | (2017.01) | |
| G11C 5/06 | (2006.01) | |
| G11C 5/02 | (2006.01) | |
| H01L 27/11582 | (2017.01) | |

(52) U.S. Cl.
CPC ........ *H01L 27/11556* (2013.01); *G11C 5/025* (2013.01); *G11C 5/06* (2013.01); *H01L 27/11582* (2013.01)

(58) Field of Classification Search
CPC ......... H01L 27/11556; H01L 27/11582; H01L 27/11573; G11C 5/025; G11C 5/06
See application file for complete search history.

(56) References Cited

U.S. PATENT DOCUMENTS

| | | | |
|---|---|---|---|
| 7,534,732 B1 | 5/2009 | Ngo et al. | |
| 8,778,758 B2 * | 7/2014 | Kubota | ............. H01L 29/66833 438/257 |
| 10,468,413 B2 | 11/2019 | Takuma et al. | |
| 2010/0038699 A1 | 2/2010 | Katsumata et al. | |
| 2011/0227025 A1 * | 9/2011 | Hirota | ................. H01L 27/1021 257/4 |
| 2012/0098108 A1 * | 4/2012 | Kim | .................... H01L 21/3105 257/640 |
| 2012/0228573 A1 * | 9/2012 | Liu | .......................... H01L 45/06 257/1 |
| 2016/0071872 A1 | 3/2016 | Saito et al. | |
| 2016/0118391 A1 * | 4/2016 | Zhao | ....................... H01L 29/16 257/66 |
| 2019/0312035 A1 | 10/2019 | Takuma et al. | |

FOREIGN PATENT DOCUMENTS

| | | |
|---|---|---|
| JP | 2016-058454 | 4/2016 |
| TW | 201721843 A | 6/2017 |

* cited by examiner

*Primary Examiner* — Shih Tsun A Chou
(74) *Attorney, Agent, or Firm* — Oblon, McClelland, Maier & Neustadt, L.L.P.

(57) ABSTRACT

According to one embodiment, a semiconductor memory device includes: a substrate; a semiconductor above the substrate functioning as a channel of a cell transistor; a first silicon nitride layer above the semiconductor having an internal compressive stress of a first value; and a second silicon nitride layer above the first silicon nitride layer having an internal compressive stress of a second value. The second value is greater than the first value.

4 Claims, 6 Drawing Sheets

| Internal compressive stress | Density | Amount of N-H couplings | Amount of Si-H couplings |
|---|---|---|---|
| HC2 (> HC1) | D2 (> D1) (N-H rich) | N2 (> N1) | S2 |
| HC1 | D1 | N1 | S1 (> S2) |

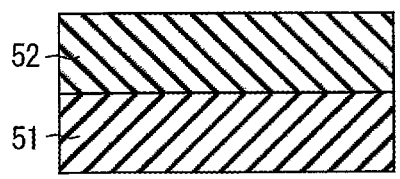
| Internal stress | Density | Amount of N-H couplings |
|---|---|---|
| H2 (> H1) | D2 (> D1) (N-H rich) | B2 (> B1) |
| H1 | D1 | B1 |
F I G. 2

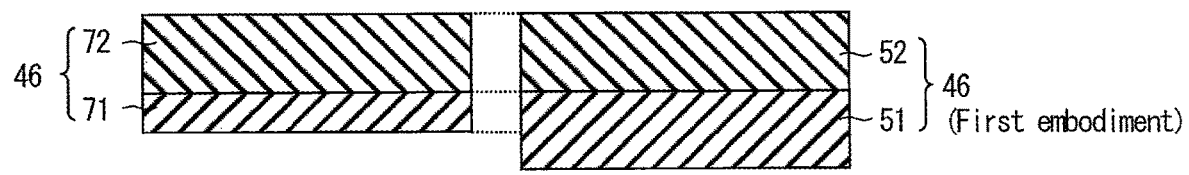
F I G. 5
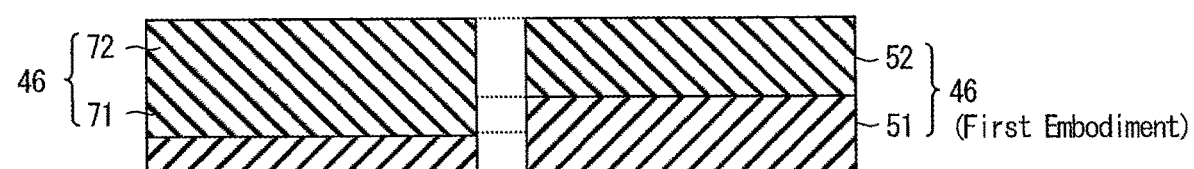
F I G. 6

SEMICONDUCTOR MEMORY DEVICE

CROSS-REFERENCE TO RELATED APPLICATIONS

This application is a Continuation-in-Part Application of U.S. patent application Ser. No. 16/294,026, filed Mar. 6, 2019 and based upon and claiming the benefit of priority from Japanese Patent Application No. 2018-98529, filed May 23, 2018, the entire contents of all of which are incorporated herein by reference.

FIELD

Embodiments described herein relate generally to a semiconductor memory device.

BACKGROUND

A semiconductor chip may have a passivation layer on its surface.

BRIEF DESCRIPTION OF THE DRAWINGS

FIG. 2 illustrates characteristics of a lower silicon nitride layer and an upper silicon nitride layer of the first embodiment.

FIG. 5 illustrates characteristics of a lower silicon nitride layer and an upper silicon nitride layer of the second embodiment.

FIG. 6 illustrates characteristics of a lower silicon nitride layer and an upper silicon nitride layer of the second embodiment.

DETAILED DESCRIPTION

Figure 1:
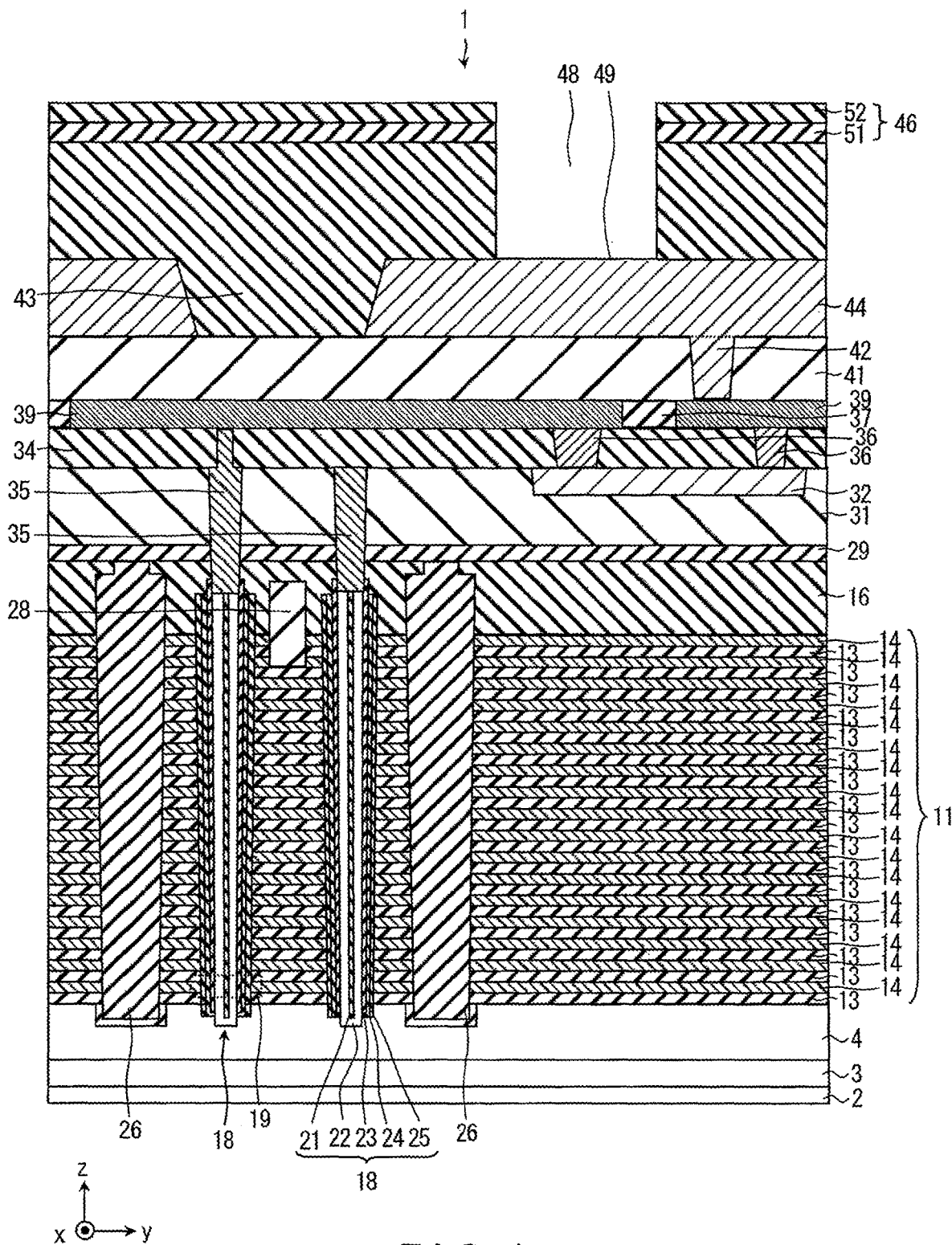
FIG. 1 schematically shows a cross-sectional structure of a semiconductor memory device according to a first embodiment.

In general, according to one embodiment, a semiconductor memory device includes: a substrate; a semiconductor above the substrate functioning as a channel of a cell transistor; a first silicon nitride layer above the semiconductor having an internal compressive stress of a first value; and a second silicon nitride layer above the first silicon nitride layer having an internal compressive stress of a second value. The second value is greater than the first value.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. Moreover, the figures may include components which differ in relations and/or ratios of dimensions in different figures. The entire description for a particular embodiment also applies to another embodiment unless it is explicitly mentioned otherwise or obviously eliminated. Each embodiment illustrates the device and method for materializing the technical idea of that embodiment, and the technical idea of an embodiment does not specify the quality of the material, shape, structure, arrangement of components, etc. to the following.

First Embodiment

FIG. 1 schematically shows a cross-sectional structure of a semiconductor memory device 1 according to the first embodiment. As shown in FIG. 1, an n-type well (n-well) 3 is formed in a region of the surface of a substrate (semiconductor chip) 2 made of a semiconductor such as silicon. In the region of the surface of the n-well 3, a p-type well (p-well) 4 is formed. Instead of such a structure, metal oxide semiconductor (MOS) transistors may be formed above the upper surface of the substrate 2 along the x-y plane, and conductors functioning as source lines may be formed above the upper surface of the substrate 2, extending along the x-y plane, with insulators being interposed therebetween.

A stack of layers, or a layer stack, 11 is provided on the upper surface of the substrate 2. The layer stack includes insulators 13 and conductors 14. The insulators 13 and the conductors 14 extend along the x-y plane above the upper surface of the substrate 2, and are alternately arranged on the upper surface of the substrate 2 and in a direction being away from the substrate 2. In other words, a first layer of the insulators 13 is located on the upper surface of the substrate 2, and a first layer of the conductors 14 is located on the upper surface of the first layer of the insulators 13, a second layer of the insulators 13 is located on the first layer of the conductors 14, and a second layer of the conductors 14 is located on the upper surface of the second layer of the insulators 13, and such a structure is repeatedly arranged. The conductors 14 include or are made of tungsten.

The conductors 14 can be formed by replacement of a so-called sacrificial materials. Specifically, insulators serving as the sacrificial materials are formed where the conductors 14 will be formed, the insulators are removed, and the conductors 14 are formed where the insulators have been positioned, for example.

Insulator 16 is provided on the upper surface of conductor 14 which is located at the uppermost layer. Insulator 16 may include stacked insulators of different types.

Memory pillars 18 are provided below insulator 16 and inside the layer stack 11. Each memory pillar 18 has a shape of a pillar, extends along the z-axis, and is located inside the substrate 2 in its edge. In each memory pillar 18, the part surrounded by each conductor 14 functions as one cell transistor 19.

Each memory pillar 18 includes insulator 21, semiconductor 22, insulator 23, insulator 24, and insulator 25. Insulator 21 extends along the z-axis at the center of memory pillar 18, and contains a silicon oxide or is made of a silicon oxide, for example. Semiconductor 22, which extends along the z-axis and surrounds insulator 21, is located inside the p-well 4 at its end, and contains polysilicon or is made of polysilicon for example.

Semiconductor 22 can function as a channel region of cell transistor 19.

Insulator 23, which extends along the z-axis and surrounds semiconductor 22, includes or is made of layers of a silicon oxide and a silicon nitride, for example.

Insulator 23 can function as a gate insulator of cell transistor 19.

Insulator 24, which extends along the z-axis and surrounds insulator 23, contains or is made of a silicon nitride, for example. Insulator 23 can function as a charge storage layer of cell transistor 19, and can trap electrons to store data by cell transistor 19.

Insulator 24 may be conductor 24. In this case, conductor 24 consists of multiple independent parts that are mutually divided in the direction along the z-axis. Each part of conductor 24 faces one of the conductors 14 in the direction along the y-axis, and can trap electrons to store data by cell transistor 19.

Insulator 25, which extends along the z-axis and surrounds insulator 24, contains or is made of a silicon oxide, for example. Insulator 25 can function as a block insulator of cell transistor 19.

Insulator 26 is provided inside insulator 16 and the layer stack 11. Insulator 26 extends along the x-z plane, ranges from the upper surface to the bottom surface of the layer stack 11, and separates conductors 14. Insulator 26 is located inside the p-well 4 at its end. Insulator 26 may have a structure in which multiple insulators of different types are combined. Insulator 26 may have a function of electrically separating one set of specific memory pillars 18 from another, for example.

Insulator 28 is provided in a region between two adjacent memory pillars 18. Insulator 28 ranges from the lower portion of insulator 16 to the upper portion of insulator 11. Insulator 28 ranges from the upper edge of the layer stack 11 to two or three of the conductors 14, and separates these conductors 14 into two parts, which are arranged side by side along the y-axis.

Silicon nitride layer 29 is provided on the upper surface of insulator 16. Silicon nitride layer 29 extends along the x-y plane, and contains or is made of a silicon nitride. Insulator 31 is provided on the upper surface of silicon nitride layer 29. Conductor 32 is provided in the upper portion of insulator 31. Insulator 34 is provided on the upper surface of insulator 31. Insulator 34 extends along the x-y plane.

Conductive plugs 35 are provided inside insulators 34 and 31, silicon nitride layer 29, and insulator 16. A plug 35 extends along the z-axis inside insulator 31, silicon nitride layer 29, and insulator 16, and is coupled to the upper surface of one of the memory pillars 18 at its bottom surface. Another plug 35 extends along the z-axis inside insulators 34 and 31, silicon nitride layer 29, and insulator 16, and is coupled to the upper surface of another one of the memory pillars 18 at its bottom surface.

Conductive plug 36 is provided inside insulator 34. Plug 36 is coupled to the upper surface of conductor 32 at the bottom surface of plug 36.

Insulator 37 is provided on the upper surface of insulator 34. Insulator 37 extends along the x-y plane. Conductor 39 is provided inside insulator 37. Conductor 39 contains or is made of copper (Cu), for example. A conductor 39 is coupled to the upper surface of a plug 36 at its bottom surface. Another conductor 39 is coupled to the upper surface of a plug 36 and to the upper surface of a plug 35 at its bottom surface.

Insulator 41 is provided on the upper surface of insulator 37. Insulator 41 extends along the x-y plane. Conductive plug 42 is provided inside insulator 41. Plug 42 is coupled to the upper surface of a conductor 39 at its bottom surface.

Insulator 43 is provided on the upper surface of insulator 41. Insulator 43, which extends along the x-y plane, contains or is made of a silicon oxide, for example. Conductor 44 is provided in the inside of the lower portion of insulator 43. Conductor 44 contains or is made of aluminum (Al), for example. Conductor 44 is coupled to the upper surface of plug 42 at its bottom surface. Conductor 44 and plug 42 can have a dual-damascene structure.

Silicon nitride layer 46 is provided on the upper surface of insulator 43. Silicon nitride layer 46 contains or is made of a silicon nitride. Silicon nitride layer 46 and insulator 43 have an opening 48. The opening 48 passes through a part of insulator 43 from the upper surface of silicon nitride layer 46, and reaches the upper surface of conductor 44. In the upper surface of conductor 44, the portion 49 which is exposed by the opening 48 can function as a pad of the semiconductor memory device 1.

Silicon nitride layer 46, which extends along the x-y plane, can function as a passivation layer, and includes silicon nitride layer 51 and silicon nitride layer 52.

Silicon nitride layer 51 is located in the lower portion of silicon nitride layer 46, and is located on the upper surface of insulator 43. Silicon nitride layer 51 may be referred to as lower silicon nitride layer 51 hereinafter. Silicon nitride layer 52 is located on the upper surface of lower silicon nitride layer 51, and may be referred to as upper silicon nitride layer 52 hereinafter. Upper silicon nitride layer 52 has properties different from those of lower silicon nitride layer 51, as will be described below.

FIG. 2 illustrates characteristics of lower silicon nitride layer 51 and upper silicon nitride layer 52 of the first embodiment. As shown in FIG. 2, lower silicon nitride layer 51 has internal stress H1 and density D1. Upper silicon nitride layer 52 has internal stress H2 and density D2. Internal stress H2 and density D2 satisfy the following relationship: H2>H1 and/or D2>D1. One or two of the above inequalities regarding H2, H1, D2, and D1 can be satisfied.

To satisfy H2>H1, upper silicon nitride layer 52 and lower silicon nitride layer 51 can be formed as will be described below for example.

For example, lower silicon nitride layer 51 can be formed in an atmosphere where a $SiH_4$ gas has a ratio RS1, and upper silicon nitride layer 52 can be formed in an atmosphere where a $SiH_4$ gas has a ratio RS2 (<RS1). Alternatively, lower silicon nitride layer 51 can be formed in an atmosphere where an $NH_3$ gas has a ratio RN1, and upper silicon nitride layer 52 can be formed in an atmosphere where an $NH_3$ gas has a ratio RN2 (>RN1).

Alternatively, lower silicon nitride layer 51 can be formed by chemical vapor deposition (CVD) at a radio frequency RF of an output O1, and upper silicon nitride layer 52 can be formed by CVD at an RF of an output O2 (>O1).

To satisfy D2>D1, upper silicon nitride layer 52 can be N—H rich for example, and upper silicon nitride layer 52 can have an amount (B2) of N—H couplings (number of N—H couplings) greater than an amount (B1) of N—H couplings contained in lower silicon nitride layer 51.

Advantageous Effects

According to the first embodiment, it is possible to provide a semiconductor memory device 1 that has the semiconductor chip with less warp and cell transistors 19 with improved characteristics, as will be described below.

Characteristics of a cell transistor for which silicon is used can be improved by reducing the number of unbound silicon atoms. To this end, hydrogen is supplied to silicon, and silicon atoms, which are unbound before the supply of hydrogen, can be bound with hydrogen atoms. Hydrogen can be supplied from an insulator or a conductor which is formed after forming silicon, for example, and can be supplied from a passivation layer that contains a silicon nitride.

In a semiconductor chip, such as a three-dimensional NAND flash memory formed through a process of replacing materials such as those used for forming the conductors 14, an internal stress in the direction of compression (internal compressive stress) remains, and this stress residue may result in warping the semiconductor chip on the side of the surface on which the components (or, elements) are constructed (namely, the lower side of the z-axis coordinate). In some cases, such warp of the semiconductor chip can be suppressed by canceling the internal stress of the semiconductor chip (except for the passivation layer) by increasing the thickness of the passivation layer containing a silicon nitride or increasing an internal compressive stress of the passivation layer through increasing the density of the passivation layer. The density of the passivation layer containing a silicon nitride can be increased by making the passivation layer N—H rich, in other words, by increasing an amount of N—H couplings in the passivation layer.

However, an amount of hydrogen in the passivation layer is decreased as a result of increasing the amount of N—H couplings in the passivation layer as a whole. This interferes with improvement of characteristics of the cell transistor through the supply of hydrogen to silicon.

It is thus difficult to realize both suppression of warp of a semiconductor chip and improvement of characteristics of the cell transistor 19.

According to the first embodiment, silicon nitride layer 46 includes lower silicon nitride layer 51, and upper silicon nitride layer 52 that is located on lower silicon nitride layer 51 and has characteristics different from those of lower silicon nitride layer 51. As an example, lower silicon nitride layer 51 has internal stress H1 and density D1, and upper silicon nitride layer 52 has internal stress H2 and density D2, and H2>H1, and/or D2>D1 are satisfied.

In contrast, lower silicon nitride layer 51 can be made of a common silicon nitride layer, unlike upper silicon nitride layer 52 which is N—H rich, and lower silicon nitride layer 51 can emit much hydrogen compared to upper silicon nitride layer 52. Particularly, even if an amount of hydrogen emitted from upper silicon nitride layer 52 is small because of upper silicon nitride layer 52 being N—H rich so as to have a density higher than that of lower silicon nitride layer 51, lower silicon nitride layer 51 can emit a larger amount of hydrogen than upper silicon nitride layer 52 can, because lower silicon nitride layer 51 is not N—H rich. Thus, in silicon nitride layer 46, even if an amount of hydrogen supplied from upper silicon nitride layer 52 is small because of upper silicon nitride layer 52 being N—H rich, it is possible to suppress reduction in an amount of hydrogen emitted from silicon nitride layer 46 by the emission of hydrogen from lower silicon nitride layer 51. In other words, cell transistors 19 with improved characteristics can be realized. Accordingly, it is possible to provide semiconductor memory device 1 having the semiconductor chip with less warp and cell transistors 19 with improved characteristics.

<Modifications>

Figure 3:
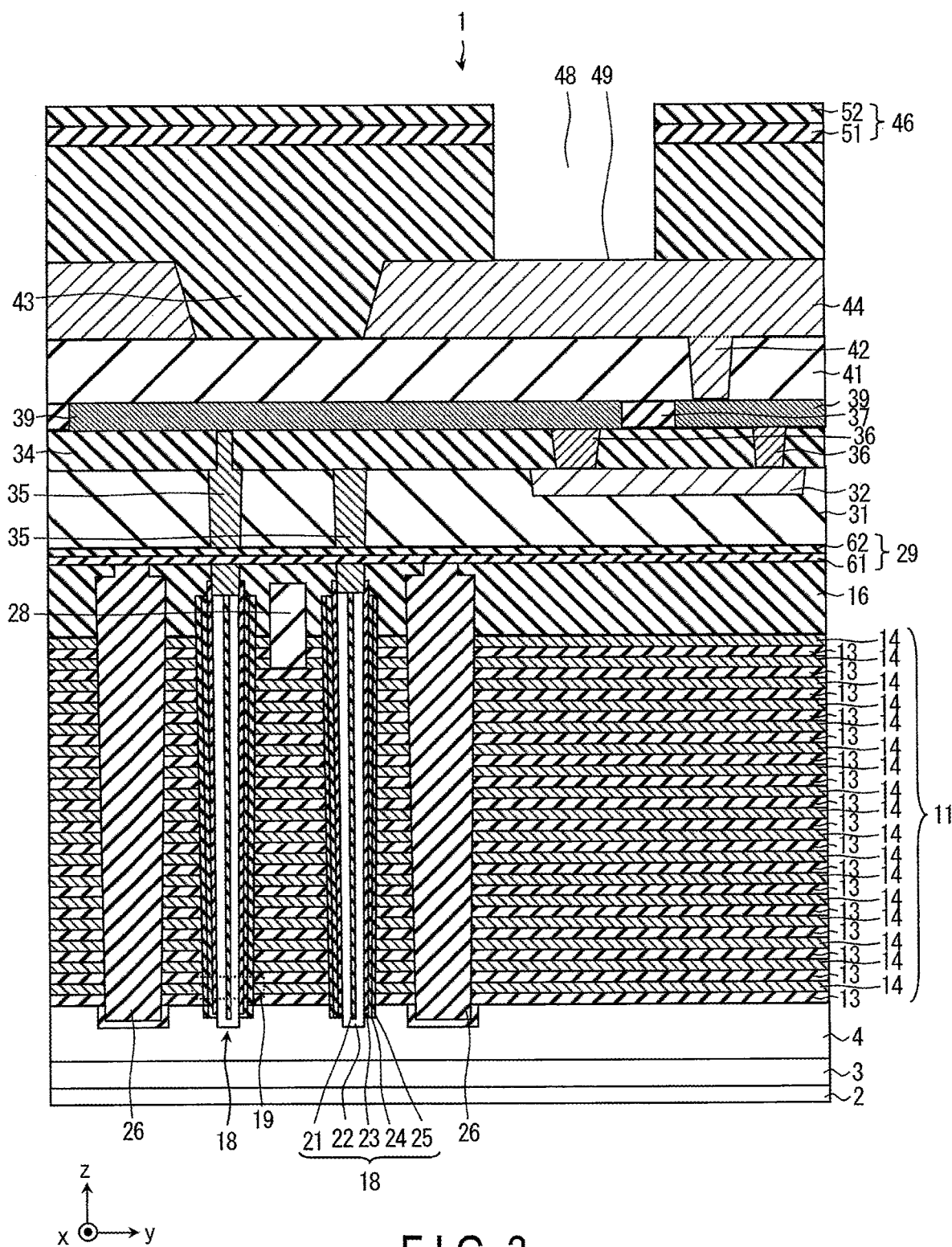
FIG. 3 shows a cross-sectional structure of a semiconductor memory device of a modification of the first embodiment.

The foregoing description relates to an example where silicon nitride layer 46 has lower silicon nitride layer 51 and upper silicon nitride layer 52 each having different characteristics. The first embodiment is not limited to this example, and another silicon nitride layer may have two silicon nitride layers having different characteristics, like silicon nitride layer 46. FIG. 3 illustrates such an example, showing a cross-sectional structure of the semiconductor memory device 1 according to a modification of the first embodiment, and illustrates the structure of the same position as in FIG. 1. As an example, silicon nitride layer 29 has two silicon nitride layers that are stacked and have different characteristics. One or both of silicon nitride layers 46 and 29 may have a two-layer structure. FIG. 3 shows an example in which each of silicon nitride layers 46 and 29 has two layers.

As shown in FIG. 3, in addition to the structure shown in FIG. 1, the semiconductor memory device 1 has silicon nitride layer 29 that includes lower silicon nitride layer 61 and upper silicon nitride layer 62. Upper silicon nitride layer 62 is located on the upper surface of insulator 16, and upper silicon nitride layer 62 is located on the upper surface of lower silicon nitride layer 61, and insulator 31 is located on the upper surface of upper silicon nitride layer 62.

The relationship between characteristics of lower silicon nitride layer 61 and those of upper silicon nitride layer 62 may be the same as the relationship between the relationship between characteristics of lower silicon nitride layer 51 and those of upper silicon nitride layer 52. In other words, lower silicon nitride layer 61 has internal stress H3 and density D3, and upper silicon nitride layer 62 has internal stress H4 and density D4, and H4>H3, and/or D4>D3 are satisfied. Internal stress H1 and H2, and density D1 and D2 may be the same as or different from internal stress H3 and H4, and density D3 and D4.

According to the modification, similarly to use of silicon nitride layer 46, it is possible to secure emission of hydrogen from lower silicon nitride layer 61, and to prevent upper silicon nitride layer 62 from becoming warped.

Second Embodiment

The second embodiment is different from the first embodiment mainly in the characteristics of lower silicon nitride layer 51. The description of the second embodiment will focus mainly on the points that differ from the first embodiment.

Figure 4:
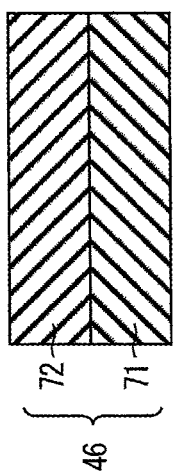
FIG. 4 illustrates characteristics of a lower silicon nitride layer and an upper silicon nitride layer of the second embodiment.

The semiconductor memory device 1 according to the second embodiment has the same structure as the semiconductor memory device 1 of the first embodiment (FIG. 1), except for one point. The difference of the second embodiment is that, as shown in FIG. 4, silicon nitride layer 46 has lower silicon nitride layer 71 and upper silicon nitride layer 72, instead of lower silicon nitride layer 51 and silicon nitride layer 52. FIG. 4 illustrates details of silicon nitride layer 46 of the second embodiment, and characteristics of lower silicon nitride layer 71 and upper silicon nitride layer 72.

Lower silicon nitride layer 71 is located on the upper surface of insulator 43, and upper silicon nitride layer 72 is located on the upper surface of lower silicon nitride layer 71.

Upper silicon nitride layer 72 can have the same characteristics as those of upper silicon nitride layer 52 of the first embodiment, and lower silicon nitride layer 71 can have the same characteristics as those of lower silicon nitride layer 51 of the first embodiment. In addition, lower silicon nitride layer 71 may be Si—H rich, and for example, it may contain an amount of Si—H couplings S1 greater than an amount of Si—H couplings S2 contained in upper silicon nitride layer 72. For this reason, lower silicon nitride layer 71 may contain an amount of N—H couplings N1 smaller than an amount of N—H couplings N2 contained in upper silicon nitride layer 72. Due to the less amount of N—H couplings contained in lower silicon nitride layer 71 than in upper silicon nitride layer 72, lower silicon nitride layer 71 may have a lower density than a density of upper silicon nitride layer 72.

As aforementioned, lower silicon nitride layer 71 is Si—H rich. For this reason, an amount of hydrogen emitted from a part per unit area of lower silicon nitride layer 71 is larger than an amount of hydrogen emitted from a part per unit area of silicon nitride layer which is not Si—H rich or contains less Si—H couplings than lower silicon nitride layer 71 (e.g., lower silicon nitride layer 51). Therefore, for example, with lower silicon nitride layer 71 having substantially the same thickness as lower silicon nitride layer 51 of the first embodiment, since lower silicon nitride layer 71 is Si—H rich, an amount of hydrogen emitted from lower silicon nitride layer 71 is larger than an amount of hydrogen emitted from lower silicon nitride layer 51.

An amount of hydrogen emitted from lower silicon nitride layer 71 can be controlled through the adjustment of an amount of Si—H couplings in lower silicon nitride layer 71. Furthermore, since it is possible to adjust an amount of hydrogen emitted from lower silicon nitride layer 71, lower silicon nitride layer 71 and upper silicon nitride layer 72 can have characteristics, such as those described below as applied examples.

As a first applied example, as shown in FIG. 5, lower nitride silicon layer 71 containing a larger amount of Si—H couplings can emit a larger amount of hydrogen, even if lower nitride silicon layer 71 is smaller in volume. Accordingly, lower silicon nitride layer 71 having a larger amount of Si—H couplings can be thinner. For example, when lower silicon nitride layer 71 has an amount of Si—H couplings to a degree that allows emission of hydrogen at substantially the same amount as the amount of hydrogen emitted from lower silicon nitride layer 51 of the first embodiment, lower silicon nitride layer 71 can be thinner than lower silicon nitride layer 51.

As a second applied example, as shown in FIG. 6, when lower silicon nitride layer 71 can be thin, upper silicon nitride layer 72 can be thick. For example, when lower silicon nitride layer 71 is thinner than upper silicon nitride layer 72 by a thickness A in a case where the thickness of silicon nitride layer 46 is the same in the first and second embodiments, upper silicon nitride layer 72 can be thicker than lower silicon nitride layer 71 by the thickness A.

According to the second embodiment, similarly to the first embodiment, lower silicon nitride layer 71 and upper silicon nitride layer 72 satisfy the relationships H2>H1, and/or D2>D1. Thus, the second embodiment offers the same advantageous features as in the first embodiment.

Further according to the second embodiment, lower silicon nitride layer 71 is Si—H rich, and has a larger amount of Si—H couplings than the amount of Si—H couplings contained in upper silicon nitride layer 72, for example. For this reason, an amount of hydrogen emitted from lower silicon nitride layer 71 is larger than that from lower silicon nitride layer 51, and in the second embodiment, the characteristics of cell transistor 19 are more improved than the characteristics of the cell transistor 19 in the first embodiment. Thus, it is possible to prevent a warp of a semiconductor chip, and to realize a cell transistor 19 with higher performance than a cell transistor 19 in the first embodiment.

According to the second embodiment, the following advantageous effects can be further obtained through the adjustment of an amount of Si—H couplings contained in lower silicon nitride layer 71.

First, as in the first applied example, lower silicon nitride layer 71 can be thinner than lower silicon nitride 51 in order that silicon nitride layer 46 emits a same amount of hydrogen as an amount of hydrogen emitted from silicon nitride layer 46 of the first embodiment. Therefore, a cost required for manufacturing lower silicon nitride layer 71 can be lowered.

Furthermore, as in the second applied example, upper silicon nitride layer 72 can be thick because lower silicon nitride layer 71 can be thin as in the second applied example. With thicker upper silicon nitride layer 72, it is more difficult for a chip of the semiconductor memory device 1 to become warped. For example, in a case that the thickness of silicon nitride layer 46 is the same in the first and second embodiments, when lower silicon nitride layer 71 is thinner than upper silicon nitride layer 72 by a thickness A, upper silicon nitride layer 72 can be thicker than lower silicon nitride layer 71 by the thickness A. Thus, it is more difficult for a chip of the semiconductor memory device 1 of the second embodiment to become warped than a chip of the semiconductor memory device 1 of the first embodiment, because of upper silicon nitride layer 72 of the first embodiment being thicker than upper silicon nitride layer 52 of the first embodiment. Similarly to the modification of the first embodiment, lower silicon nitride layer 61 of silicon nitride layer 29 (FIG. 3) may be Si—H rich, for example, and may contain a higher amount of Si—H couplings than upper silicon nitride layer 72, like lower silicon nitride layer 71.

Third Embodiment

The third embodiment differs from the first embodiment in the details of passivation layer 46. The description of the second embodiment will focus mainly on the points that differ from the first embodiment.

Figure 7:
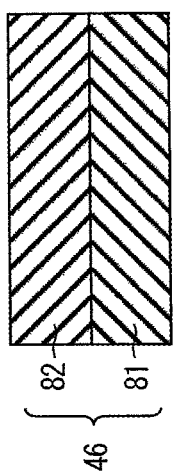
FIG. 7 illustrates characteristics of a lower silicon nitride layer and an upper silicon nitride layer of a third embodiment.

The semiconductor memory device 1 according to the third embodiment has the same structure as the semiconductor memory device 1 of the first embodiment (FIG. 1), except for one point. The difference is, as shown in FIG. 7, that silicon nitride layer 46 has lower silicon nitride layer 81 and upper silicon nitride layer 82 in the third embodiment, instead of lower silicon nitride layer 51 and upper silicon nitride layer 52. FIG. 7 illustrates the details of silicon nitride layer 46 of the third embodiment, and characteristics of lower silicon nitride layer 81 and upper silicon nitride layer 82.

Lower silicon nitride layer 81 is located on the upper surface of insulator 43, and upper silicon nitride layer 82 is located on the upper surface of lower silicon nitride layer 81. Both lower silicon nitride layer 81 and upper silicon nitride layer 82 have an internal compressive stress.

FIG. 7 shows characteristics of lower silicon nitride layer 81 and upper silicon nitride layer 82 of the third embodiment. Similar to the first embodiment, lower silicon nitride 81 has an internal stress higher than that of upper silicon nitride layer 82; particularly, as shown in FIG. 7, the relationship is applicable to the internal compressive stress in the third embodiment. In other words, lower silicon nitride layer 81 has an internal compressive stress HC1, and upper silicon nitride layer 82 has an internal compressive stress HC2, which is larger than the internal compressive stress HC1.

As described above, the internal compressive stress of the passivation layer of a layer that includes a silicon nitride can be increased through increasing the density of the passivation. Thus, upper silicon nitride layer 82 can have the density D2 higher than the density D1 of lower silicon nitride layer 81. As described in the first embodiment, the density of the passivation layer of a layer that includes a silicon nitride can be increased through making the passivation layer N—H rich, in other words, increasing an amount of N—H couplings in the passivation layer. Therefore, similarly to the first embodiment, upper silicon nitride layer 82 can have an amount of N—H couplings N2 higher than an amount of N—H couplings N1 of lower silicon nitride layer 81.

Furthermore, it is possible to combine the second embodiment to the third embodiment, and lower silicon nitride layer 81 can be Si—H rich; for example, lower silicon nitride layer 81 can have an amount of Si—H couplings S1 higher than the amount of Si—H couplings S2 included in upper silicon nitride layer 82.

Advantageous Effects

When a semiconductor chip (semiconductor substrate 2) undergoes an annealing process in an assembling process, a compressive force acts on the semiconductor substrate 2. The semiconductor substrate 2 has an internal compressive stress as a reaction to heat, and if the semiconductor substrate 2 has an internal compressive stress at a sufficiently higher level, the semiconductor substrate 2 can maintain its shape in resistance to an externally-applied compressive force caused by heat. However, the internal compressive stress is sometimes insufficient, depending on the temperature of the annealing process. In such a case, the semiconductor substrate 2 may be warped.

Such a warp of the semiconductor substrate 2 caused by the annealing process may be suppressed by a passivation layer having a high internal compressive stress. The internal stress of the passivation layer that includes a silicon nitride can be increased through making the passivation layer N—H rich, in other words, increasing an amount of N—H couplings in the passivation layer.

However, the increase of an amount of N—H couplings in the passivation layer as a whole may interfere with improvement of characteristics of a cell transistor through the supply of hydrogen to silicon, as described in the first embodiment.

According to the third embodiment, upper silicon nitride layer 82 has an internal compressive stress HC2 higher than the internal compressive stress HC1 of lower silicon nitride layer 81. On the other hand, similar to the first embodiment, lower silicon nitride layer 81 can be made of a common silicon nitride layer, unlike the N—H rich upper silicon nitride layer 82, and can emit much hydrogen compared to upper silicon nitride layer 82. Particularly, even if an amount of hydrogen emitted from upper silicon nitride layer 82 is small because of upper silicon nitride layer 82 being N—H rich so as to have an internal compressive stress higher than that of lower silicon nitride layer 81, lower silicon nitride layer 81 can emit a larger amount of hydrogen than upper silicon nitride layer 82 can, because lower silicon nitride layer 81 is not N—H rich. Thus, similarly to the first embodiment, it is possible to provide semiconductor memory device 1 having the semiconductor substrate 2 with less warp and cell transistors 19 with improved characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a semiconductor above the substrate, the semiconductor functioning as a channel of a cell transistor;
a first silicon nitride layer above the semiconductor, the first silicon nitride layer having an internal compressive stress of a first value; and
a second silicon nitride layer above the first silicon nitride layer; the second silicon nitride layer having an internal compressive stress of a second value, the second value being greater than the first value, wherein
the first silicon nitride layer has an amount of N—H couplings of a third value,
the second silicon nitride layer has an amount of N—H couplings of a fourth value, and,
the fourth value is greater than the third value.

2. The device according to claim 1, wherein
the first silicon nitride layer has a density of a fifth value,
the second silicon nitride layer has a density of a sixth value, and
the sixth value is greater than the fifth value.

3. The device according to claim 1, wherein
the second silicon nitride layer is located on a surface of the semiconductor memory device.

4. The device according to claim 1, wherein
the first silicon nitride layer has an amount of Si—H couplings of a seventh value,
the second silicon nitride layer has an amount of Si—H couplings of an eighth value, and
the eighth value is smaller than the seventh value.

* * * * *